United States Patent
Takeuchi et al.

(10) Patent No.: US 8,134,176 B2
(45) Date of Patent: Mar. 13, 2012

(54) LIGHT-EMITTING DIODE AND LIGHT-EMITTING DIODE LAMP

(75) Inventors: Ryouichi Takeuchi, Chichibu (JP); Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 410 days.

(21) Appl. No.: 11/997,110

(22) PCT Filed: Jul. 27, 2006

(86) PCT No.: PCT/JP2006/315347
§ 371 (c)(1),
(2), (4) Date: Mar. 10, 2010

(87) PCT Pub. No.: WO2007/013674
PCT Pub. Date: Feb. 1, 2007

(65) Prior Publication Data
US 2010/0155742 A1    Jun. 24, 2010

(30) Foreign Application Priority Data
Jul. 28, 2005    (JP) .................................. 2005-218932

(51) Int. Cl.
*H01L 27/15* (2006.01)
(52) U.S. Cl. .................... 257/103; 257/79; 257/E33.013
(58) Field of Classification Search .................... 257/77, 257/79–103, E33.023, E33.013
See application file for complete search history.

(56) References Cited

U.S. PATENT DOCUMENTS

| | | | |
|---|---|---|---|
| 5,293,055 A * | 3/1994 | Hara et al. | 257/296 |
| 5,636,234 A | 6/1997 | Takagi | |
| 6,191,437 B1 * | 2/2001 | Sonobe et al. | 257/94 |
| 6,333,522 B1 * | 12/2001 | Inoue et al. | 257/99 |
| 2004/0094756 A1 * | 5/2004 | Moon et al. | 257/13 |
| 2005/0121679 A1 | 6/2005 | Nagahama et al. | |
| 2005/0139840 A1 | 6/2005 | Lai et al. | |
| 2007/0090383 A1 | 4/2007 | Ota et al. | |

FOREIGN PATENT DOCUMENTS

| | | |
|---|---|---|
| JP | 52-61982 | 5/1977 |
| JP | 8-264898 A | 10/1996 |
| JP | 10-200159 | 7/1998 |
| JP | 2000-188425 | 7/2000 |

(Continued)

OTHER PUBLICATIONS

Hiroo Yonezu, Ph.D.; "Photoemitter/Photorecptor Device"; Kougakutosho Co., Ltd.; Feb. 15, 1984.

*Primary Examiner* — Tucker Wright
(74) *Attorney, Agent, or Firm* — Sughrue Mion, PLLC

(57) ABSTRACT

The present invention provides a light-emitting diode (10) including a substrate (101) made of a first conductive type silicon (Si) single crystal, a pn junction structured light-emitting section (40) composed of a III-group nitride semiconductor on the substrate, a first polarity ohmic electrode (107*a*) for the first conductive type semiconductor provided on the light-emitting section (40) and a second polarity ohmic electrode (108) for a second conductive type semiconductor on the same side as the light-emitting section (40) with respect to the substrate (101), wherein a second pn junction structure (30) is provided which is made up of a pn junction between the first conductive type semiconductor layer (102) and the second conductive type semiconductor layer (103) which is different from the pn junction structure of the light-emitting section (10).

10 Claims, 4 Drawing Sheets

FOREIGN PATENT DOCUMENTS

| | | |
|---|---|---|
| JP | 2001127309 A | 5/2001 |
| JP | 2001308381 A | 11/2001 |
| JP | 2002-94079 A | 3/2002 |
| JP | 2004-153169 A | 5/2004 |
| JP | 2005-20038 | 1/2005 |
| JP | 2005-57228 | 3/2005 |
| JP | 2005-93991 A | 4/2005 |
| TW | 376587 | 12/1999 |
| TW | 533604 B | 5/2003 |
| TW | 541709 B | 7/2003 |

* cited by examiner

LIGHT-EMITTING DIODE AND LIGHT-EMITTING DIODE LAMP

CROSS REFERENCE TO RELATED APPLICATIONS

This application is a National Stage of International Application No. PCT/JP2006/315347 filed on Jul. 27, 2006, claiming priority based on Japanese Patent Application No. 2005-218932, filed Jul. 28, 2005, the contents of all of which are incorporated herein by reference in their entirety.

TECHNICAL FIELD

The present invention relates to a light-emitting diode provided with a first conductive type silicon single crystal substrate, a light-emitting section including a first pn junction structure composed of a III-group nitride semiconductor on the silicon single crystal substrate, a first polarity ohmic electrode for a first conductive type semiconductor provided on the light-emitting section and a second polarity ohmic electrode for a second conductive type semiconductor on the same side as the light-emitting section with respect to the silicon single crystal substrate, and a light-emitting diode lamp using the light-emitting diode.

BACKGROUND ART

To obtain a pn junction type light-emitting diode (LED) which operates stably for a long period of time, it is important to provide technical means capable of preventing a reverse overcurrent from accidentally passing to a pn junction type light-emitting section due to, for example, static electricity. Conventionally, a method of electrically protecting the LED by connecting an electronic part such as a Zener diode to the LED has often been used for the purpose of improving an electric break-down property of the LED. Especially for a gallium nitride (GaN) base or aluminum gallium indium phosphide (AlGaInP) base LEDs provided with a pn junction type light-emitting section composed of a thin compound semiconductor layer, means for purposely adding and incorporating a Zener diode to/in an LED drive electric circuit and improving a break-down voltage property is disclosed (see JP-A 2005-20038 (Patent Document 1)).

Furthermore, JP-A 2005-57228 (Patent Document 2) and JP-A 2000-188425 (Patent Document 3) disclose a technique of improving a break-down voltage property of an LED by providing an LED drive power circuit in which capacitors and resistors are incorporated in a complicated way.

Furthermore, a technique of improving a break-down voltage property against an LED reverse voltage by providing a pn junction type LED and a pn junction type protective diode independently of the LED and electrically connecting them in parallel (see JP-A SHO 52-61982 (Patent Document 4)). Furthermore, in addition to the above described technique of providing a pn junction type protective diode as a single element independent of the LED, technical means for avoiding a reverse overvoltage from applying to a pn junction type light-emitting section by providing a pn junction type protective diode on the same substrate adjacently and separately is also disclosed (see JP-A HEI 10-200159 (Patent Document 5)).

However, of the above described prior arts, Patent Documents 1 to 3 require a space for adding an electronic part to the power circuit to improve the break-down voltage property of the Zener diode and capacitor or the like, which results in a problem that the size of the LED is increased uselessly. Furthermore, increasing the number of electronic parts incorporated in the power circuit to further improve the break-down voltage property results in a problem of further complicating the circuit assembly technique and making it unavoidable to increase LED manufacturing cost.

Furthermore, as shown in Patent Documents 4 and 5, when a protective diode is used as a single part separately and at the same time electrically connected in parallel to improve the break-down voltage property against a reverse current which passes to the pn junction type light-emitting section accidentally, a space for arranging the protective diode is required and the chip size of the LED bonded naturally increases. Furthermore, in order to display the function of electrically protecting the pn junction type light-emitting section from an accidental reverse overcurrent, the protective diode provided separately from the LED needs to be provided with an electrode for operating the protective diode itself is necessary in addition to the electrode necessary to pass an operating current to the light-emitting section of the LED. For example, a total of three (see FIG. 4 in Patent Document 4) or a total of four (see FIG. 1 in Patent Document 4) input and output electrodes need to be formed at most for the LED with the pn junction type protective diode as a single unit described in above Patent Document 4, which undoubtedly complicates the process of manufacturing the LED.

The present invention has been proposed in view of the above described problems and it is an object of the present invention to provide a light-emitting diode and light-emitting diode lamp capable of reducing the size and cost even when a break-down voltage is improved and also eliminating the necessity for any protective diode.

DISCLOSURE OF THE INVENTION

1) In order to attain the above described object, a first invention is a light-emitting diode including a first conductive type silicon single crystal substrate, a light-emitting section including a first pn junction structure composed of a III-group nitride semiconductor on the silicon single crystal substrate, a first polarity ohmic electrode for the first conductive type semiconductor provided on the light-emitting section and a second polarity ohmic electrode for a second conductive type semiconductor on the same side as the light-emitting section with respect to the silicon single crystal substrate, wherein the first conductive type silicon single crystal substrate and the second conductive type semiconductor layer provided joined to the silicon single crystal substrate form a second pn junction structure in a region which extends from the silicon single crystal substrate to the light-emitting section.

2) A second invention is a light-emitting diode including a first conductive type silicon single crystal substrate, a light-emitting section including a first pn junction structure composed of a III-group nitride semiconductor on the silicon single crystal substrate, a first polarity ohmic electrode for a first conductive type semiconductor provided on the light-emitting section and a second polarity ohmic electrode for a second conductive type semiconductor on the same side as the light-emitting section with respect to the silicon single crystal substrate, wherein a second conductive type intermediate layer provided joined to the first conductive type silicon single crystal substrate and a second conductive type semiconductor layer provided joined to the intermediate layer are provided, and the first conductive type silicon single crystal substrate and the second conductive type intermediate layer form a second pn junction structure in a region which extends from the silicon single crystal substrate to the light-emitting section.

3) A third invention is a light-emitting diode including a first conductive type silicon single crystal substrate, a light-emitting section including a first pn junction structure composed of a III-group nitride semiconductor on the silicon single crystal substrate, a first polarity ohmic electrode for a first conductive type semiconductor provided on the light-emitting section and a second polarity ohmic electrode for a second conductive type semiconductor on the same side as the light-emitting section with respect to the silicon single crystal substrate, wherein a first conductive type intermediate layer provided joined to the first conductive type silicon single crystal substrate and a second conductive type semiconductor layer provided joined to the intermediate layer are provided, and the first conductive type intermediate layer and the second conductive type semiconductor form a second pn junction structure in a region which extends from the silicon single crystal substrate to the light-emitting section.

4) In a fourth invention, the intermediate layer is made of silicon carbide (SiC) having a silicon-rich nonstoichiometric composition in addition to the configuration of the inventions described in 2) or 3).

5) In a fifth invention, the intermediate layer is made of a III-group nitride semiconductor in addition to the configuration of the inventions described in 2) or 3).

6) In a sixth invention, the second conductive type semiconductor layer is made of boron phosphide (BP) base semiconductor in addition to the configuration of the inventions described in any one of 1) to 5).

7) In a seventh invention, the second conductive type semiconductor layer is made of a second conductive type III-group nitride semiconductor material in addition to the configuration of the inventions described in any one of 1) to 5).

8) In an eighth invention, the reverse break-down voltage of the pn junction structure in the second pn junction structure is higher than the forward voltage of the light-emitting diode provided with the light-emitting section including the first pn junction structure and lower than the reverse voltage of the light-emitting diode in addition to the configuration of the inventions described in any one of 1) to 7).

9) A ninth invention is a light-emitting diode lamp configured by fixing the light-emitting diode described in 8) to a supporter, wherein the first conductive type silicon single crystal substrate and the first polarity ohmic electrode are electrically connected to substantially the same potential.

10) In a tenth invention, the region of the supporter electrically contacting the first conductive type silicon single crystal substrate is set to substantially the same potential as that of the first polarity ohmic electrode in addition to the configuration of the inventions described in 9).

The present invention configures the second pn junction structure in the region which extends from the silicon single crystal substrate to the light-emitting section in addition to the first pn junction structure of the light-emitting section, configures the second pn junction structure, for example, with the first conductive type silicon single crystal substrate and the second conductive type semiconductor layer provided joined to the silicon single crystal substrate, furthermore provides the second conductive type intermediate layer provided joined to the first conductive type silicon single crystal substrate and the second conductive type semiconductor layer provided joined to the intermediate layer to configure the second pn junction structure with the first conductive type silicon single crystal substrate and the second conductive type intermediate layer, and further provides the first conductive type intermediate layer provided joined to the first conductive type silicon single crystal substrate and the second conductive type semiconductor layer provided joined to the intermediate layer to configure the second pn junction structure with the first conductive type intermediate layer and the second conductive type semiconductor layer, and can thereby improve a break-down voltage of the light-emitting diode (LED).

Furthermore, the present invention eliminates the necessity for newly adding any protective diode or the like as in the case of the prior art, eliminates the necessity for additionally providing any electrode to electrically connect the LED and the electronic parts thereof and needs only to provide a minimum necessary anode and cathode to operate the LED, and can thereby provide a small LED in a simple way.

Furthermore, the present invention provides the pn junction structure for improving the reverse break-down voltage property to be included in the same LED chip in the region which extends from the silicon single crystal substrate to the light-emitting section, and can thereby configure a pn junction effective in preventing an overcurrent from flowing into the light-emitting section and preventing the light-emitting section from being destroyed by a reverse voltage accidentally applied due to static electricity or the like and thereby improve the reverse break-down voltage property.

Especially, since the second pn junction structure provided in the region which extends from the silicon single crystal substrate to the light-emitting section is configured using the intermediate layer, the above described reverse break-down voltage property can further be improved.

Furthermore, the present invention configures the second conductive type semiconductor layer making up the second pn junction structure for improving the reverse breakdown voltage property to be included in the same LED chip with silicon carbide whose forbidden band gap is relatively large and a III-group nitride semiconductor, and can thereby configure the pn junction structure with a high break-down voltage property effective in preventing an overcurrent from flowing into the light-emitting section and preventing the light-emitting section from being destroyed by a reverse voltage accidentally applied due to static electricity or the like.

Furthermore, the present invention makes the reverse break-down voltage of the second pn junction structure higher than the forward voltage of the LED provided with the pn junction type light-emitting section and lower than the reverse voltage of the LED, and can thereby stably and effectively prevent an overcurrent from flowing into the light-emitting section due to the reverse voltage which is accidentally applied and thereby provide an LED with an excellent reverse break-down voltage property.

Furthermore, when manufacturing the LED lamp by fixing the LED to the supporter, the present invention manufactures the first conductive type silicon single crystal substrate and the first polarity ohmic electrode by electrically connecting them to substantially the same potential, and can thereby simply provide an LED lamp with an excellent reverse break-down voltage property against the reverse voltage accidentally applied due to static electricity or the like without adding any electronic parts such as a protective diode as in the case of the prior art.

Furthermore, the present invention configures an LED lamp by electrically connecting the first conductive type silicon single crystal substrate and the region of the electrically contacting supporter to substantially the same potential as that of the first polarity ohmic electrode, and can thereby reliably prevent the reverse overcurrent from accidentally flowing into the light-emitting section of the LED due to static electricity or the like and thereby provide an LED lamp having an excellent reverse break-down voltage property without adding any electronic parts such as a protective diode as in the case of the prior art.

BEST MODE FOR CARRYING OUT THE INVENTION

Figure 1:
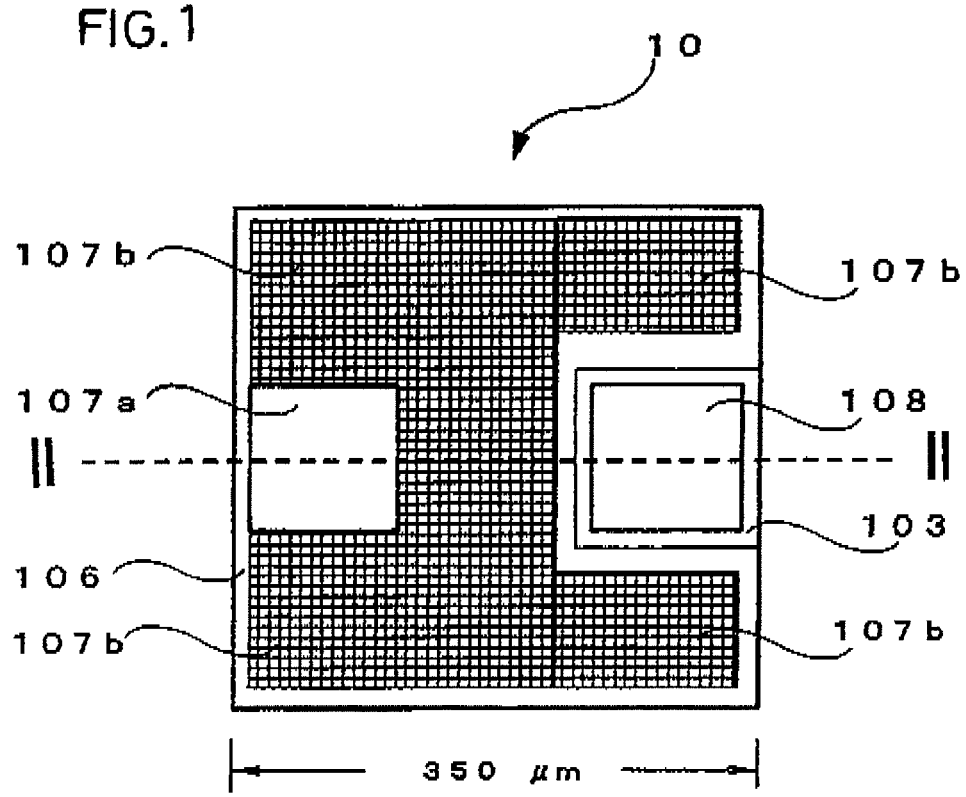
FIG. 1 is a schematic plan view of an LED according to Embodiment 1 of the present invention.

According to the present invention, a pn junction type structured light-emitting section is formed on a substrate made of silicon (Si) single crystal. Any one of n-type and p-type conductive type silicon single crystals can be used for the substrate. In the following explanations, any one of n-type and p-type is assumed to be a first conductive type and the other is assumed to be a second conductive type. The conductive type of the silicon single crystal used for the substrate is assumed to be the first conductive type. As will be described later, the semiconductor layer on which the first polarity ohmic electrode is provided is also assumed to be the first conductive type semiconductor layer.

The light-emitting section is composed of a III-group nitride semiconductor material such as gallium nitride (GaN), gallium nitride indium mix crystal (composition formula $Ga_XIn_{1-X}N$: $0<X<1$) and aluminum nitride gallium mix crystal (composition formula $Al_YGa_{1-Y}N$: $0<Y<1$). The light-emitting section can be constructed of any one of a single hetero (SH) and double hetero (DH) structures. The light-emitting layer provided for the light-emitting section can also be composed of a single quantum well (SQW) structure or multiple quantum well (MQW) structure made of, for example, $Al_YGa_{1-Y}N/Ga_XIn_{1-X}N$.

The present invention provides a light-emitting diode provided with a first conductive type silicon single crystal substrate, a light-emitting section including a first pn junction structure made of a III-group nitride semiconductor on the silicon single crystal substrate, a first polarity ohmic electrode for first conductive type semiconductor provided on the light-emitting section and a second polarity ohmic electrode for second conductive type semiconductor on the same side as the light-emitting section with respect to the silicon single crystal substrate, wherein a second pn junction structure is configured in a region which extends from the silicon single crystal substrate to the light-emitting section. This second pn junction structure is configured, for example, with (1) a first conductive type silicon single crystal substrate and a second conductive type semiconductor layer provided joined to the silicon single crystal substrate, furthermore, (2) by providing a second conductive type intermediate layer provided joined to the first conductive type silicon single crystal substrate and a second conductive type semiconductor layer provided joined to the intermediate layer, the first conductive type silicon single crystal substrate and the second conductive type intermediate layer, and (3) by providing a first conductive type intermediate layer provided joined to the first conductive type silicon single crystal substrate and a second conductive type semiconductor layer provided joined to the intermediate layer, the first conductive type intermediate layer and second conductive type semiconductor layer. In the configurations (1), (2) and (3), the second conductive type semiconductor layer may also be the bottom layer of the light-emitting section.

Suppose the second conductive type semiconductor layer is formed joined to the surface of the first conductive type silicon single crystal substrate and the second pn junction structure is provided in the region which extends from the silicon single crystal substrate to the light-emitting section. For example, an n-type semiconductor layer is provided joined to the p-type silicon single crystal substrate to form a second pn junction structure. In this case, the first conductive type is a p-type and therefore the second conductive type is an n-type. Furthermore, a high resistance p-type semiconductor layer is provided on the n-type silicon single crystal substrate to form a pn junction structure (the high resistance p-type layer may be referred to as a π-type layer (see "Optical Communication Element Engineering—Light-Emitting Device and Photodetector" Hiroo Yonezu, May 20, 1995, Kogaku-tosho Publishing Inc., fifth edition, footnote on p. 317)). Furthermore, in another example, a second pn junction structure is composed of the p-type silicon single crystal substrate and the high resistance n-type semiconductor layer provided joined thereto (the high resistance n-type layer may also be referred to as a ν-type (see "Optical Communication Element Engineering—Light-Emitting and Light-Receiving Elements" above).

More specifically, the pn junction structure is composed of a buffer layer made of a III-group nitride semiconductor material of a conductive type opposite to silicon single crystal of the substrate provided joined to the first conductive type silicon single crystal substrate. Furthermore, the pn junction structure is composed of, for example, the first conductive type silicon single crystal substrate and a lower clad layer provided joined thereto and forming part of the light-emitting section. As will be described later, the second conductive type semiconductor layer to be joined to the first conductive type silicon single crystal substrate preferably has carrier concentration (or resistivity (=specific resistance)) and a layer thickness such that a convenient reverse break-down voltage results. If the pn junction structure is composed of a semiconductor material having extremely high resistance and a large layer thickness, an overcurrent due to an overvoltage accidentally applied reversely is not allowed to effectively escape to a second polarity ohmic electrode which will be described later through the conductive n-type or p-type silicon single crystal substrate and bypassing the LED light-emitting section.

The second pn junction structure provided in the region which extends from the first conductive type silicon single crystal substrate to the light-emitting section may also be configured using an intermediate layer provided at a midpoint between the first conductive type silicon single crystal substrate and the second conductive type semiconductor layer thereon. The intermediate layer can also be composed of the semiconductor layer of any one of the first and second conductive type semiconductor layers. That is, the intermediate layer can be composed of the semiconductor layer of any one of p-type (π-type) and n-type (ν-type) conductive types. When the intermediate layer of the pn junction structure made up of the first conductive type silicon single crystal substrate/intermediate layer/second conductive type semiconductor layer (symbols "/" denotes junction) is composed of the first conductive type semiconductor layer, the pn junction is formed of the intermediate layer and second conductive type semiconductor layer. When the intermediate layer is configured with the second conductive type semiconductor layer, the pn junction is formed of the intermediate layer and the first conductive type silicon single crystal substrate.

When the intermediate layer is configured with a semiconductor material having a relatively high forbidden band gap at a room temperature, it has an advantage in bringing a pn junction structure with high and stable reverse break-down voltage. For example, the intermediate layer is composed of cubic crystal or hexagonal crystal silicon carbide (SiC). The intermediate layer made of silicon carbide can be formed using, for example, a chemical vapor deposition (CVD) method. The pn junction structure can be formed by irradiating a hydrocarbon gas such as acetylene (molecular formula: $C_2H_2$) onto the surface of silicon single crystal in vacuum and using a cubic crystal 3C-type SIC thin layer formed on the surface of silicon single crystal as the high resistance layer. A [001]-oriented 3C-type SIC layer can be formed using a silicon single crystal substrate having the [001] crystal surface as its surface. A [111]-oriented 3C-type SiC layer can be formed using a silicon single crystal substrate having the [111] crystal surface as its surface.

Suppose the silicon carbide layer for configuring the intermediate layer has resistivity (=specific resistance) of less than $1 \times 10^4$ Ω·cm, a layer thickness of 10 nm or less, more preferably 5 nm or less. The resistivity of the silicon carbide layer used or carrier concentration ($n(cm^{-3})$ or $p(cm^{-3})$) inversely proportional to the resistivity and layer thickness (d(cm)) are adjusted in such a way that the pn junction structure including the silicon carbide layer as the intermediate layer is convenient to realize a reverse voltage which is higher than the forward voltage of the LED and lower than the reverse voltage. The intermediate layer can be preferably configured especially from silicon carbide of a nonstoichiometric composition. It can be composed of a nonstoichiometric composition containing quantitatively more silicon (Si) than carbon (element symbol: C), for example, $SiC_{0.6}$. Providing the silicon carbide layer of such a nonstoichiometric composition as the intermediate layer reduces lattice mismatch between the silicon single crystal substrate and upper layer provided on the intermediate layer or stress caused by a difference in a coefficient of thermal expansion and can bring about the upper layer having an excellent crystal layer.

Furthermore, the intermediate layer can be composed of a III-group nitride semiconductor material having a wide forbidden band gap (Eg) at a room temperature. For example, wurtzite crystal type GaN (Eg=3.4 eV), zinc blende crystal GaN (Eg=3.2 eV), nitride semiconductor mix crystal containing aluminum (Al) such as aluminum nitride (AlN: Eg=5.9 eV), aluminum indium nitride (composition formula $Al_Q In_{1-Q}N$: 0<Q<1). The second pn junction structure according to the present invention provided in the region which extends from the silicon single crystal substrate to the light-emitting section is configured by sequentially stacking, for example, an n-type III-group nitride semiconductor layer and n-type III-group nitride semiconductor layer on the p-type silicon single crystal substrate. The intermediate layer composed of the III-group nitride semiconductor material can contribute as an underlayer which can provide a high-quality upper layer when stacking a second conductive type nitride semiconductor layer thereon.

Furthermore, the second conductive type semiconductor layer can be composed of a boron phosphide (BP) base compound semiconductor material. The boron phosphide base compound semiconductor refers to III-V group compound semiconductor containing boron (element symbol: B) and phosphorus (element symbol: P) as components. It is, for example, boron phosphide aluminum (composition formula $B_X Al_{1-X}P$: 0<X≦1), boron phosphide gallium (composition formula $B_Y Ga_{1-Y}P$: 0<Y≦1) and boron phosphide indium (composition formula $B_Z In_{1-Z}P$: 0<Z≦1). For example, the forbidden band gap at a room temperature can be composed of monomeric BP of 2.0 eV or more. The layer made up of a boron phosphide base semiconductor material having such a wide forbidden band gap can also be used as a material for making up the intermediate layer.

The second conductive boron phosphide base semiconductor layer can be formed using a metal organic chemical vapor deposition (MOCVD) method, halogen vapor phase epitaxial (WE) method, hydride VPE method, or an epitaxial growth method such as molecular beam epitaxial (MBE) method. The MOCVD method in particular which is commonly used for growth of a compound semiconductor thin-film containing phosphorus (P) as a component is suitably used. The second conductive type boron phosphide base compound semiconductor layer having resistivity and layer thickness which give a desired reverse break-down voltage can also be formed without intentionally adding impurities (undoped). Furthermore, it can also be formed by so-called doping means by intentionally adding p-type impurities or n-type impurities during growth.

The intermediate layer and second conductive type semiconductor layer may also be formed using different means, but it is simpler to configure this layer using the same growth means. To obtain a second conductive type semiconductor layer having carrier concentration and layer thickness in a preferable range, impurities for controlling the conductive type may also be intentionally added (doped) during growth of these layers. The second conductive type semiconductor layer composed of a III-group nitride semiconductor material functions as a convenient underlayer which brings a III-group nitride semiconductor layer with excellent crystallinity thereon and thereby has an advantage of being able to configure the light-emitting section from a high quality III-group nitride semiconductor layer. For example, if $Al_R Ga_{1-R}N$ (0≦R≦1) forming a light-emitting section is stacked on the second conductive type semiconductor layer made of GaN, AlN or mix crystal thereof, a high quality configuration layer of the light-emitting section can be formed because the degree of lattice mismatch is small. When, for example, the $Al_R Ga_{1-R}N$ (0≦R≦1) layer is used as an under clad layer to be provided on the silicon single crystal substrate below the light-emitting section, suppose the conductive type of the $Al_R Ga_{1-R}N$ (0≦R≦1) is a second conductive type.

Regardless of whether to configure the second conductive type semiconductor layer by being directly connected to the surface of the first conductive type silicon single crystal substrate or configuring it with the intermediate layer interposed as described above, the pn junction structure provided below the light-emitting section is higher than the forward voltage of the LED (so-called $V_F$ of pn junction making up the light-emitting section) and also has a reverse break-down voltage ($V_B$) which is smaller than the reverse voltage (so-called $V_R$ of pn junction making up the light-emitting section). For example, suppose $V_H$ exceeds twice the forward voltage of the LED ($V_F$ (unit: V)) when the forward current is assumed to be 10 μA and is smaller than ½ of the reverse voltage of the LED ($V_R$ (unit: V)) (indicates a reverse voltage when a current of 10 μA is passed here). That is, it is preferable to have a pn junction structure having a reverse break-down voltage ($V_B$) which gives a magnitude relationship of $0.5 \cdot V_R > V_B > 2.0 \cdot V_F$.

A stacked structure provided with a second pn junction structure having the above described electric break-down characteristic and a pn junction structured light-emitting section placed thereon is further provided with a first polarity ohmic electrode and a second ohmic electrode having polarity opposite to the first polarity and an LED is configured. When the first conductive type is of a p-type, the substrate is p-type silicon single crystal and the first polarity ohmic electrode is a first conductive type semiconductor layer, that is, an anode (positive pole, (+) pole) provided on the p-type semiconductor layer. Accordingly, suppose the second polarity ohmic electrode is a cathode (negative pole, (−) pole). On the contrary, if the first conductive type is an n-type, suppose the first polarity ohmic electrode is a cathode provided on the n-type semiconductor layer. To correspond to this case, suppose the second polarity ohmic electrode is an anode.

The first and second polarity ohmic electrodes for making up the LED of the present invention are arranged in regions opposed to each other in a plan view on the same side as the light-emitting section with respect to the surface of the substrate, whereas the respective ohmic electrodes are formed at different positions in the vertical direction (vertical direction of the LED). The first polarity ohmic electrode is provided in the first conductive type semiconductor layer stacked above the light-emitting layer provided for the light-emitting section. For example, an upper clad layer provided on the light-emitting layer to configure the heterojunction type light-emitting section, a window layer provided on the light-emitting section and a contact layer to form a low contact resistance first polarity ohmic electrode are provided in contact with the first conductive type semiconductor layer.

The first polarity ohmic electrode is formed as a pad electrode made of an ohmic metallic film provided on the surface of the semiconductor layer to apply bonding which provides substantially the same potential as that of a conductor. Furthermore, the configuration can also be realized with the pad electrode and the first polarity ohmic electrode which is made electrically connection with the pad electrode and spread over the surface of the first conductive type semiconductor layer on the light-emitting layer or light-emitting section. Arranging the first polarity ohmic electrode by spreading it over the whole surface of the first conductive type semiconductor layer makes it possible to produce an effect of two-dimensionally distributing the drive current to cause the LED to emit light in the forward direction. The forward current is a current which flows, when the first polarity ohmic electrode is the anode and the second polarity ohmic electrode is the cathode, between both polarity ohmic electrodes when a positive voltage is applied to the anode and a voltage lower than the positive voltage is applied to the cathode. It is also a current which flows, when the first polarity ohmic electrode is the cathode and the second polarity ohmic electrode is the anode, between both polarity ohmic electrodes when a negative voltage is applied to the cathode and a voltage higher than the negative voltage is applied to the anode.

When the first polarity ohmic electrode is arranged uniformly over the surface of the first conductive type semiconductor layer in addition to the pad electrode for bonding and the forward current for producing light emission from the LED is spread over the light-emitting section through the first conductive type semiconductor layer, the electrode to be spread and the pad electrode need to be electrically connected, but the pad electrode need not always be made of a metallic film having ohmic contact with respect to the first conductive type semiconductor layer. When the pad electrode is composed of a material that forms ohmic contact with respect to the first conductive type semiconductor layer, contact resistance between the pad electrode and the first conductive type semiconductor layer increases, preventing a current from flowing like a short-circuit to the light-emitting section through the first conductive type semiconductor layer.

The pad electrode provided so as to connect electrically with the first polarity ohmic electrode is composed of a thick metallic film of approximately several μm to prevent extension of mechanical shock or thermal shock when bonding is applied thereto to the first conductive type semiconductor layer or to the light-emitting section which emits light. For this reason, light emitted from the light-emitting section in the projection region of the pad electrode is shielded by the thick metallic film making up the pad electrode and cannot be taken out of the LED. Therefore, if the pad electrode is composed of a material having a non-ohmic property with respect to the first conductive type semiconductor layer, forward current passing like short-circuit current to the light-emitting section in the projection region of the pad electrode is blocked and then the forward current is two-dimensionally spread over the first conductive type semiconductor layer through the extended electrode which is electrically connected with the pad electrode, a high brightness LED with high photoelectric conversion efficiency can be obtained.

The first polarity ohmic electrode which is made electrically connected with the pad electrode and spread over the first conductive type semiconductor layer is arranged on the surface of the first conductive type semiconductor layer or by extension arranged so as to homogeneously spread the forward current over the light-emitting section therebelow. For example, the first polarity ohmic electrode can be composed of an ohmic metallic film formed using a photolithography technique on a lattice, mesh, concentric or frame shape in a plan view. It is also composed of an electrode in a shape which allows the forward current to flow to the first conductive type semiconductor layer at a homogeneously current density. For example, it is configured in a lattice shape narrowed as the distance from the pad electrode to the second polarity ohmic electrode increases or in a concentric shape whose diameter is gradually reduced in proportion to the distance.

On the other hand, the second polarity ohmic electrode of polarity opposite to that of the first one is provided on the second conductive type semiconductor layer which makes up the light-emitting section below the light-emitting layer provided for the pn junction type light-emitting section. Alternatively, it is provided on the second conductive type semiconductor layer located between the part below the light-emitting section and the first conductive type substrate. For example, it is provided on the second conductive lower clad layer for forming a hetero-structured light-emitting section. Furthermore, it is provided in contact with, for example, a buffer layer interposed between the first conductive type substrate and the light-emitting section and a Bragg reflection layer.

Arranging the second polarity ohmic electrode on the second conductive type semiconductor layer located on the substrate side below the light-emitting layer or light-emitting section requires the light-emitting section located in the region in which the ohmic electrode is provided to be removed. That is, it is necessary to remove part of the light-emitting section which produces light emission and provide the region producing light emission with the area thereof reduced. For this reason, it is beneficial to use an electrode having a minimum planar area necessary to allow bonding as the second polarity ohmic electrode and avoid the region of the light-emitting section to be removed from increasing excessively when obtaining a high brightness LED. For example, the second polarity ohmic electrode can be composed of only the pad electrode necessary for bonding. As the pad electrode also serving as the second polarity ohmic electrode, it is possible to use a metallic electrode in a circular shape having a diameter of 80 μm to 150 μm in a plan view or a square shape, each side having a length of 80 μm to 150 μm in a plan view.

Using the LED having an excellent break-down voltage property against an accidentally applied reverse voltage according to the present invention, it is possible to manufacture an LED lamp capable of fully displaying the reverse break-down voltage property by electrically connecting the positive or negative first polarity ohmic electrode provided on the light-emitting section and the first conductive type silicon single crystal of the substrate in such a way that the two have the same potential. The first polarity ohmic electrode on the first conductive type semiconductor layer provided on the light-emitting section can be simply electrically connected with the first conductive type substrate substantially equipotentially using, for example, a method of bonding them to the same terminal at the same potential and connecting them.

The LED according to the present invention is configured such that the reverse break-down voltage (voltage $V_B$) is lower than the reverse voltage (voltage $V_R$) of the LED having the pn junction type light-emitting section. Therefore, by realizing electric bonding as described above, it is possible to allow a reverse current produced when a reverse voltage is applied accidentally to escape out of the LED not through the light-emitting section but through the positive or negative second polarity second ohmic electrode on the second conductive type semiconductor layer. Therefore, it is possible to realize an LED lamp capable of avoiding destruction of the light-emitting section of the LED due to the passage of accidental reverse overcurrent and with an excellent break-down voltage property.

On the other hand, the second pn junction structure according to the present invention is configured so that the break-down voltage (voltage $V_B$) of the LED according to the present invention is higher than the forward voltage (voltage $V_F$) of the LED having the pn junction type light-emitting section. Therefore, by realizing electrical bonding as described above, it is possible to prevent the device drive current flowing normally in the forward direction to cause the LED to emit light from accidentally leaking to the substrate. Therefore, it is possible to realize an LED lamp having an excellent break-down voltage property and excellent photoelectric conversion efficiency against an accidentally applied reverse overvoltage.

Furthermore, when manufacturing an LED lamp, if the lamp is configured in such a way that the first conductive type substrate used to configure the LED has the same potential as that of the region of the supporter for fixing the substrate and electrically contacting the substrate, it is possible to configure the lamp having an excellent break-down voltage property against an accidentally applied reverse overvoltage. It is possible to reduce the density of a reverse overcurrent which flows through the substrate by causing the back side of the first conductive type substrate (surface on the side opposite to that on which the light-emitting section is provided) to electrically contact the region of the conductive supporter which supports and fixes the substrate two-dimensionally and widely instead of point contact and equipotentially. This has an effect of allowing an accidental reverse overcurrent to efficiently escape. Even when electrical bonding is applied to cause the substrate to have the same potential as that of the conductive region of the supporter which is in electrical contact with the substrate, the present invention likewise causes the substrate to have the same potential as that of the first polarity electrode.

Next, embodiments of the present invention will be explained, but the present invention will by no means be limited by the embodiments.

Embodiment 1

This Embodiment 1 will more specifically explain the content of the present invention taking a case of configuring an LED including a pn junction structure (second pn junction structure) for improving a break-down voltage property composed of a p-type silicon single crystal substrate which is a first conductive type and an n-type semiconductor material which is a second conductive type stacked thereon as an example.

Figure 2:
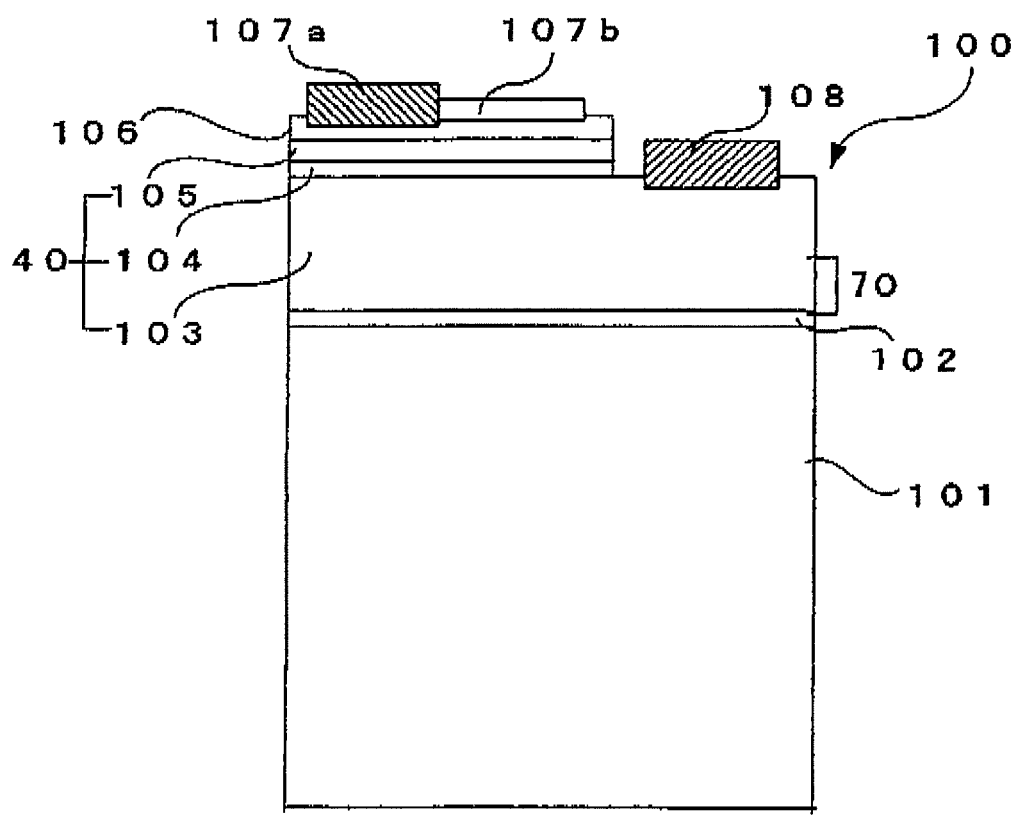
FIG. 2 is a schematic cross-sectional view along a dotted line II-II of the LED described in FIG. 1.

FIG. 1 is a schematic plan view of an LED including, in addition to a pn junction provided for a light-emitting section, a pn junction structure for improving a break-down voltage property manufactured in this embodiment outside the light-emitting section. Furthermore, FIG. 2 is a schematic cross-sectional view along a dotted line II-II of the high break-down voltage type LED shown in FIG. 1.

A stacked structure 100 for manufacturing an LED 10 was formed using a p-type silicon single crystal doped with boron (element symbol: B) and having a (001) crystal surface as a substrate 101. Therefore, in this Embodiment 1, the first conductive type is a p-type. On the surface made up of a (001) crystal surface of the silicon single crystal substrate 101, a p-type silicon carbide (SiC) thin-film layer (layer thickness of approximately 2 nm) 102 which is a cubic crystal 3C crystal type was formed as an intermediate layer referred to in the present invention. From the lattice constant of the silicon carbide thin-film layer 102 measured from a lattice image captured using a high resolution transmission electron microscope, the thin-film layer 102 was judged to be composed of $SiC_{0.6}$ having a nonstoichiometric composition. An n-type gallium nitride layer (layer thickness of approximately 3 μm, carrier concentration of approximately $4\times10^{18}$ cm$^{-3}$) 103 doped with silicon (element symbol: Si) was provided directly joined to the surface of the p-type silicon carbide thin-film layer 102. This n-type GaN layer corresponds to the second conductive (n-type in Embodiment 1) semiconductor layer referred to in the present invention.

A second pn junction structure 70 for avoiding an overcurrent from flowing through a light-emitting section 40 due to an overvoltage accidentally applied in the reverse direction was formed by providing the p-type silicon carbide thin-film layer 102 which is the first conductive type and the n-type GaN layer 103 which is the second conductive type joined together.

Separately, on a boron-doped (001)-silicon single crystal substrate of the same resistivity, carrier concentration and thickness as those used in forming the stacked structure 100, a p-type silicon carbide layer and an n-type GaN layer of the same specification as that described above were made to grow in vapor phase and a pn junction was formed. The back side of the p-type silicon single crystal substrate was coated with an aluminum (element symbol: Al) film using general vacuum evaporation means, sintered and an ohmic electrode was formed. An ohmic electrode made of a lanthanum (element symbol: La) Al alloy vacuum deposition film was formed on the surface of the n-type GaN layer and the reverse break-down voltage ($V_H$ referred to in the present invention) of this pn junction was measured. When the reverse current was set to be 10 μA, the break-down voltage was approximately 7.1 V.

On the n-type GaN layer 103 which is a component of the second pn junction structure 70, a light-emitting layer 104 having a multiple quantum well structure was stacked using an n-type gallium nitride indium mix crystal ($Ga_{1-\alpha}In_\alpha N$: average In composition ratio (=α) is 0.19) layer made up of a plurality of phases having different indium (element symbol: In) composition ratios as a well layer and an n-type aluminum nitride gallium mix crystal ($Al_{0.01}Ga_{0.99}N$) layer as a barrier layer. The light-emitting layer 104 having a multiple quantum well structure was formed assuming that the number of pairs of well layer and barrier layer was 5. On the n-type light-emitting layer 104, an upper clad layer 105 made up of a p-type $Al_{0.05}Ga_{0.95}N$ layer (layer thickness of approximately 50 nm, carrier concentration of approximately $3\times10^{17}$ $cm^{-3}$) was stacked. In this way, a pn junction type double hetero-junction structured light-emitting section 40 was formed which is made of an under clad layer made of the n-type GaN layer 103, the light-emitting layer 104 and the upper clad layer 105. On the upper clad layer 105, the first conductive type, that is, a p-type GaN layer in this Embodiment 1 was stacked as a contact layer 106.

On the p-type silicon single crystal substrate 101, the above described semiconductor layers 102 to 106 having the first or second conductive type were made to grow in vapor phase using the same molecular beam epitaxial (MBE) method, the formation of the stacked structure 100 was completed, and then from exclusively a region in which a second polarity (cathode in this Embodiment 1) ohmic electrode 108 was provided on the semiconductor layer of a second conductive type (n-type in this Embodiment 1), the semiconductor layers 104 to 106 arranged thereon were removed. For the semiconductor layers 104 to 106, regions patterned using a general photolithography technique were selectively removed using dry etching means.

After that, the second polarity ohmic electrode 108 for a second conductive type semiconductor layer (n-type semiconductor layer in this Embodiment 1) was formed on the surface of the n-type GaN layer 103 exposed using dry etching means. This second polarity (cathode) ohmic electrode which also serves as a pad electrode for bonding was composed of a La.Al alloy vapor deposition film having a film thickness of approximately 2 μm. The pad electrode 108 which also serves as the second polarity ohmic electrode was shaped into a square, each side having a length of approximately 120 μm in a plan view.

On the other hand, a partial region of the surface of the p-type GaN contact layer 106 of a first conductive type (p-type in this Embodiment) which forms the outermost layer of the stacked structure 100 was provided with a pad electrode 107a for bonding which is a quasi-square in a plan view, made of an alloy film of gold (element symbol: Au) and germanium (element symbol: Ge). Suppose the shape of the pad electrode 107a is a square, each side having a length of approximately 110 μm. Furthermore, an ohmic electrode 107b of first polarity (anode in this Embodiment 1) made of an alloy of Au and nickel (element symbol: Ni) was provided so as to be electrically connected with the pad electrode for bonding 107a. The first polarity ohmic electrode 107b was arranged in a lattice shape (see FIG. 1) so as to substantially homogeneously spread an LED drive current over the entire surface of the p-type GaN contact layer 106 of the first conductive type (p-type in this Embodiment 1) remaining after the above described dry etching was applied.

As described above, both polarity ohmic electrodes 107b and 108 of the first polarity (anode in this Embodiment 1) and second polarity (cathode in this Embodiment 1) were formed and these electrodes were then separated into individual chips using general cutting means and a square shaped chip LED 10, each side having approximately 350 μm in a plan view was obtained. When a forward current was passed between both polarity ohmic electrodes 107b and 108, blue light having a wavelength of approximately 450 nm was emitted from the LED 10 provided with the light-emitting section 40 of a pn junction type hetero-junction structure. The forward voltage ($V_F$) of the LED 10 was 3.5 V when the forward current was set to 20 mA. $V_F$ was 2.9 V when the forward current was set to 10 μA. Furthermore, the reverse voltage of the LED 10 was 15.0 V when the reverse current was set to 10 μA.

Embodiment 2

This Embodiment 2 will more specifically explain the content of the present invention by taking a case of manufacturing an LED lamp having a high break-down voltage property according to the present invention using the LED 10 described in Embodiment 1 as an example.

Figure 3:
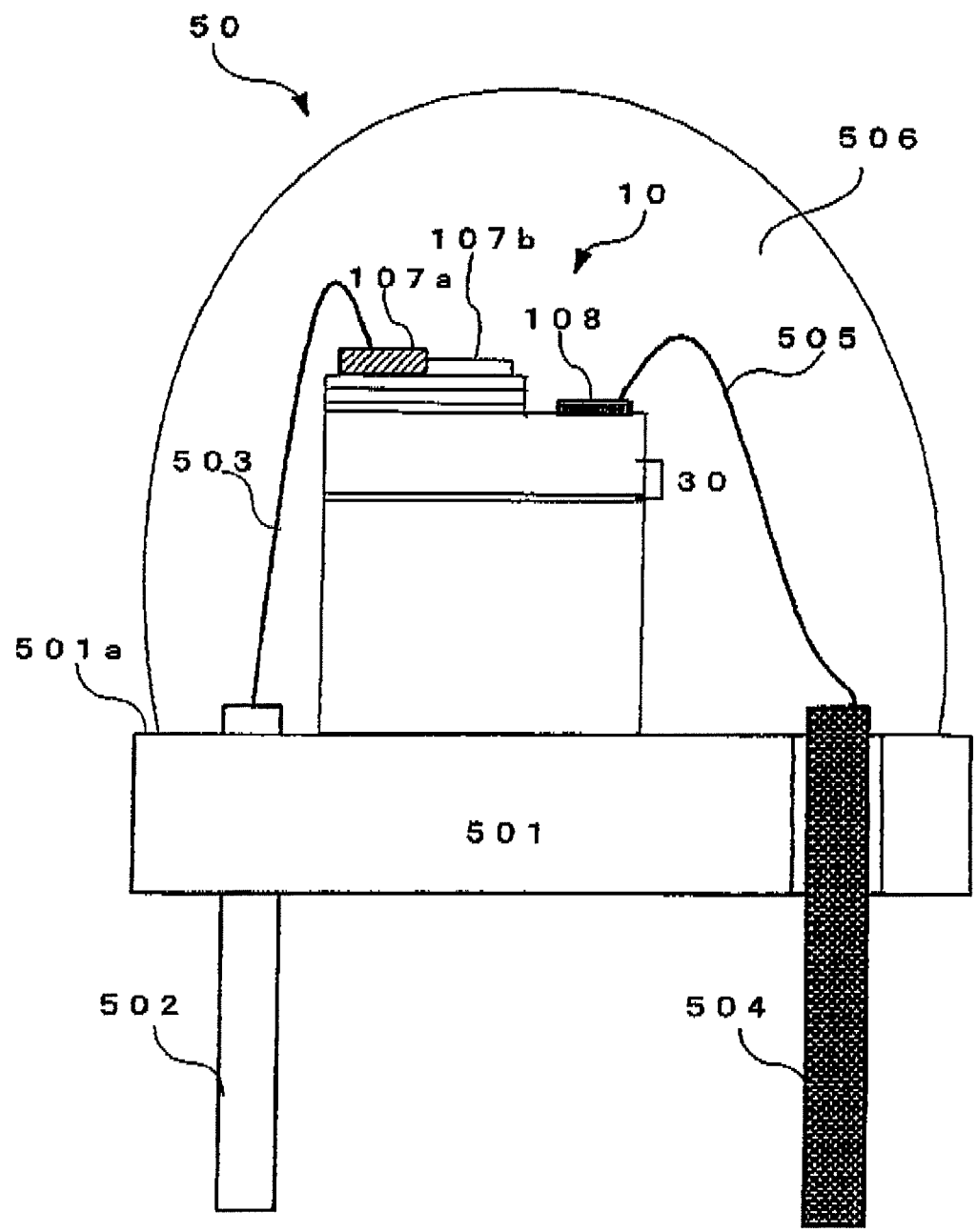
FIG. 3 is a schematic cross-sectional view of an LED lamp according to Embodiment 2 of the present invention.

FIG. 3 schematically shows a cross-sectional structure of an LED lamp 50. In FIG. 3, the same components as shown in FIG. 1 and FIG. 2 are assigned the same reference numerals.

The LED lamp 50 was manufactured by placing and fixing the chip LED 10 according to Embodiment 1 on a supporter 501. The back of the p-type silicon single crystal substrate 101 of the LED 10 was adhered with a general conductive silver (Ag) paste to be electrically connected with a flat top surface 501a of the supporter 501. Furthermore, an electrode terminal for bonding 502 which is electrically connected with the top surface 501a of the supporter 501 was electrically connected to the pad electrode 107a of the first polarity according to Embodiment 1 (which is the anode in Embodiment and is also the anode in this Embodiment 2) using a gold (Au) wire 503. This caused the silicon single crystal substrate 101 of the first conductive type (=p-type) to be equipotential to the lattice-shaped ohmic electrode 107b of the first polarity (=anode) through the pad electrode 107a.

On the other hand, the ohmic electrode 108 of the second polarity (=cathode) according to Embodiment 1 was electrically connected to another electrode terminal for bonding 504 provided electrically insulated from both the body and the top surface 501a of the supporter 501 using a gold wire 505. Bonding was applied to the silicon single crystal substrate 101 of the first conductive type (=p-type) and first polarity ohmic electrode 107b (=anode) so as not to be equipotential to the second polarity ohmic electrode 108 (=cathode). Next, the perimeter of the LED 10 was coated (molded) with general epoxy resin for semiconductor device sealing 506 and the LED lamp 50 was thereby obtained.

A forward current was passed between the electrode terminal 502 which is electrically connected with both the silicon single crystal substrate 101 of the first conductive type (=p-type) and the first polarity ohmic electrode 107b (=anode), and the electrode terminal 504 which is electrically connected with the second polarity ohmic electrode 108 (=cathode), and then optical and electrical characteristics of the LED lamp 50 were measured. The wavelength of the main light-emitting spectrum was approximately 450 nm and no particular change from the chip LED 10 according to Embodiment 1 above was observed. The luminous intensity of the LED lamp 50 measured using a general integrating sphere was approximately 2 candelas (cd).

Furthermore, the forward voltage ($V_F$) was 3.5 V when a forward current of 20 mA was passed in the forward direction and $V_F$ was 2.9 V when the forward current was set to 10 μA. The reverse voltage ($V_R$) of the LED lamp 50 when the reverse current was set to 10 to was also approximately 15 V and no particular change was observed in neither forward nor reverse voltage even after applying the above described bonding and molding to implement the LED lamp.

Next, an overvoltage was intentionally added to the LED lamp 50 and the break-down voltage property was tested. This break-down voltage property test was conducted using an electric circuit with a capacitor of 100 picofarads (pF) and a resistor of 1.5 kilo-ohm (kΩ) added and with an overvoltage of 500 V to 1000 V added in the reverse direction between both electrode terminals 502 and 504 of the LED lamp 50. After applying the overvoltage, the forward voltage ($V_F$) of the chip LED 10 making up the LED lamp 50 was measured again and the measurement result was approximately 3.6 V which was substantially the same as the value before the break-down voltage property test. That is, it was proven that even when an overvoltage was intentionally added, the pn junction provided for the light-emitting section 40 was protected from the overcurrent, not destroyed and a normal rectification characteristic was manifested. This was understood to be attributable to the fact that even when an overvoltage was applied in the reverse direction, a pn junction structure 30 of a lower break-down voltage than the reverse voltage ($V_R$) of the LED 10 which would allow the overcurrent to escape to the second polarity ohmic electrode 108 (=cathode) through the silicon single crystal substrate 101 of the first conductive type (=p-type) kept equipotential to the first polarity ohmic electrode 107b (=anode) by bypassing the light-emitting section 40 was provided right below the light-emitting section 40.

Embodiment 3

This Embodiment 3 will more specifically explain the content of the present invention by taking a case of configuring an LED including a pn junction structure (second pn junction structure) for improving a break-down voltage property, made up of a p-type silicon single crystal substrate which is a first conductive type and an n-type III-group nitride semiconductor material of a second conductive type stacked thereon as an example.

Figure 4:
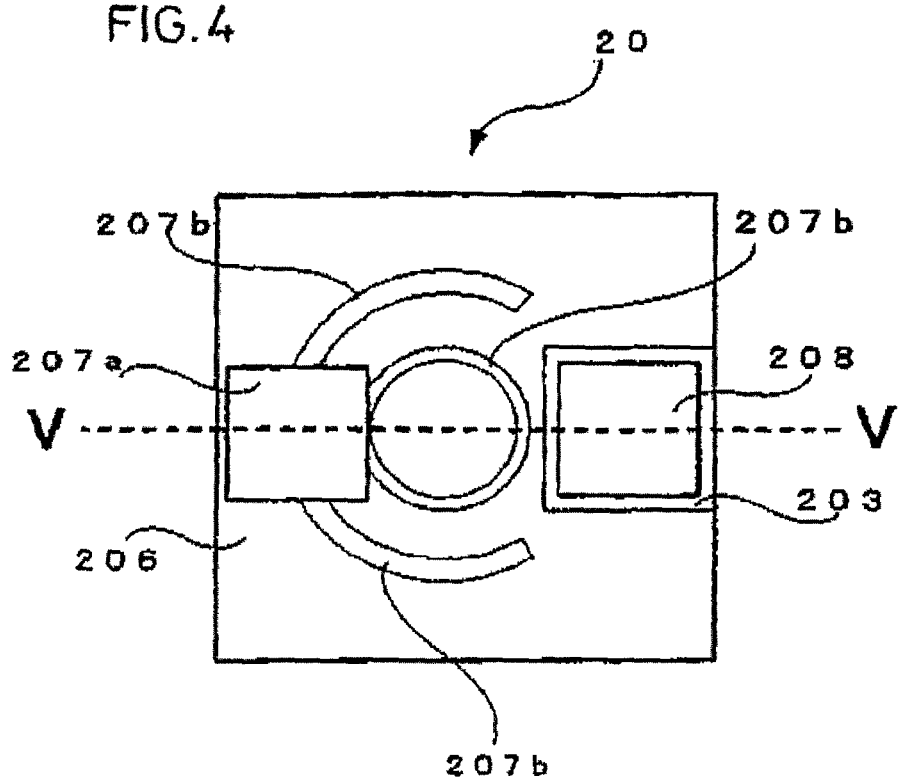
FIG. 4 is a schematic plan view of an LED according to Embodiment 3 of the present invention.
Figure 5:
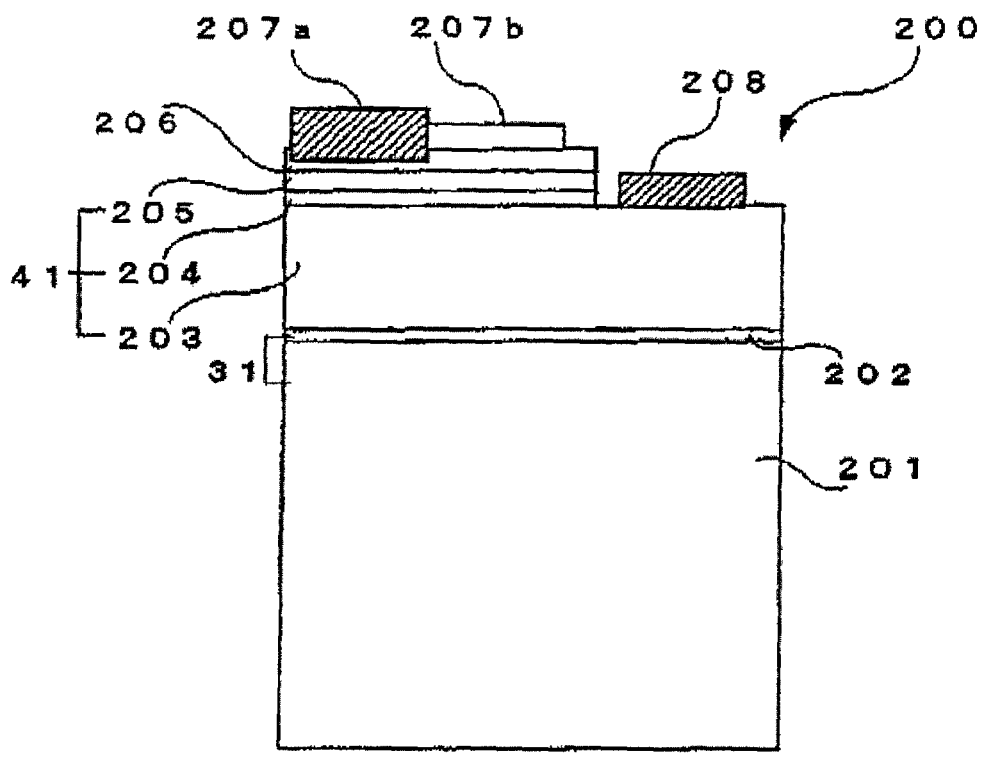
FIG. 5 is a schematic cross-sectional view along a dotted line V-V of the LED described in FIG. 4.

FIG. 4 is a schematic plan view of an LED 20 including, in addition to a pn junction provided for a light-emitting section, a pn junction structure for improving a break-down voltage property manufactured in this Embodiment 3 outside the light-emitting section. Furthermore, FIG. 5 is a schematic cross-sectional view along a dotted line V-V of the high break-down voltage type LED 20 shown in FIG. 4.

An n-type aluminum nitride (AlN) thin-film layer (layer thickness of approximately 12 nm) 202 was directly provided joined to the surface made of the (001) crystal surface of the p-type silicon single crystal substrate 201 as an intermediate layer. The n-type AlN thin-film layer 202 which is a conductive type opposite to the first conductive type (n-type in this Embodiment 3) was formed using an MBE method. This n-type AlN thin-film layer 202 corresponds to the intermediate layer of the second conductive type referred to in the present invention. By this configuration of the p-type silicon single crystal substrate 201 and the n-type AlN thin-film layer 202, a pn junction structure (second pn junction structure) 31 for avoiding an overcurrent from flowing into the light-emitting section 41 due to an overvoltage accidentally applied in the reverse direction was formed.

An n-type blende crystal type GaN layer (layer thickness of approximately 2 μm, carrier concentration of approximately $2\times10^{18}$ cm$^{-3}$) 203 doped with silicon (Si) was stacked on the surface of this n-type AlN thin-film layer 202.

Separately, on the boron-doped (001) p-type silicon single crystal substrate having the same resistivity, carrier concentration and thickness as those used to form the above described second pn junction structure 31, an n-type AlN intermediate layer of a second conductive type and an n-type GaN layer having the same specification as that described above were vapor-phase grown using an MBE method and a pn junction structure was formed. A gold (Au) film was coated on the back of the first conductive p-type silicon single crystal substrate using general vacuum deposition means, then sintered and an ohmic electrode was thereby formed. An ohmic electrode made of a titanium (element symbol: Ti) film was formed on the surface of the n-type GaN layer and the reverse break-down voltage of this pn junction ($V_B$ referred to in the present invention) was measured. The break-down voltage was approximately 7.4 V when the reverse current was set to 10 μA.

On the n-type cubic crystal GaN layer 203 which is the second conductive type (n-type in this Embodiment 3), an n-type light-emitting layer 204, a p-type upper clad layer 205 and a p-type contact layer 206 described in above Embodiment 1 were sequentially stacked using the MBE method and the stacked structure 200 was thereby formed.

After this, a first polarity ohmic electrode (anode in this Embodiment 3) 207b, and a pad electrode 207a therefor and a second polarity ohmic electrode (cathode in Embodiment 3) 208 were formed using the procedure according to Embodiment 1 as in the case of above described Embodiment 1 and the LED 20 was thereby obtained. In this Embodiment 3, the first polarity ohmic electrode 207b was shaped like concentric circles, part of the circumference of which was made discontinuous instead of the lattice shape in a plan view according to Embodiment 1 and formed in such a way that the LED drive current spread over substantially the whole surface of the contact layer 206 made of p-type GaN which is the first conductive type.

The LED 20 was fixed to the supporter according to Embodiment 2 above and bonding was applied in such a way that as in the case of the above described Embodiment 2, the p-type silicon single crystal substrate 201 of the first conductive type (p-type in this embodiment), first polarity ohmic electrode 207b and pad electrode 207a became equipotential. The second polarity ohmic electrode (cathode in this Embodiment 3) 208 was bonded to the other electrode terminal electrically insulated from the electrode terminal to which the first polarity ohmic electrode 207b was bonded. After that, the LED 20 was molded with semiconductor device sealing epoxy resin and an LED lamp was thereby formed.

When a forward current of 20 mA was passed in the forward direction between the electrode terminal continuous with the first polarity ohmic electrode 207b and the electrode terminal continuous with the second polarity ohmic electrode 208, the forward voltage ($V_F$) was approximately 3.6 V. Furthermore, the reverse voltage ($V_R$) was approximately 15.0 V when the reverse current was set to 10 μA.

30 lamps were extracted from the manufactured LED lamps and subjected to a break-down voltage test using the technique described in Embodiment 2. As a result, when an overvoltage of 1000 V was intentionally applied in the reverse direction, the normal rectification characteristic of the pn junction provided for the light-emitting section was not reproduced and there was no LED lamp whose light-emitting section was judged to be destroyed. That is it was proven that even when an overvoltage is applied accidentally or intentionally in the reverse direction, a high break-down voltage LED lamp can be stably provided by including the pn junction structure (second pn junction structure) having a break-down voltage ($V_B$) related to $V_F$ and $V_R$ as described in the present invention.

Embodiment 4

This Embodiment 4 will more specifically explain the content of the present invention by taking a case of configuring an LED including a pn junction structure for improving a breakdown voltage property made up of an n-type silicon single crystal substrate of a first conductive type and a p-type monomeric boron phosphide (BP) of a second conductive type stacked thereon as an example.

Figure 6:
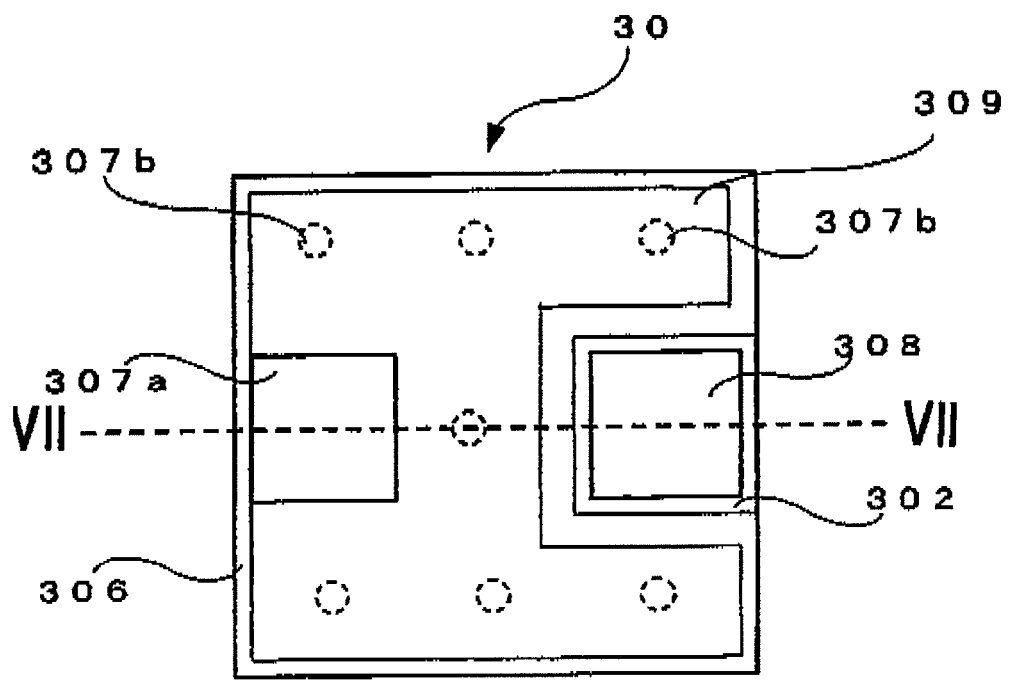
FIG. 6 is a schematic plan view of an LED according to Embodiment 4 of the present invention.
Figure 7:
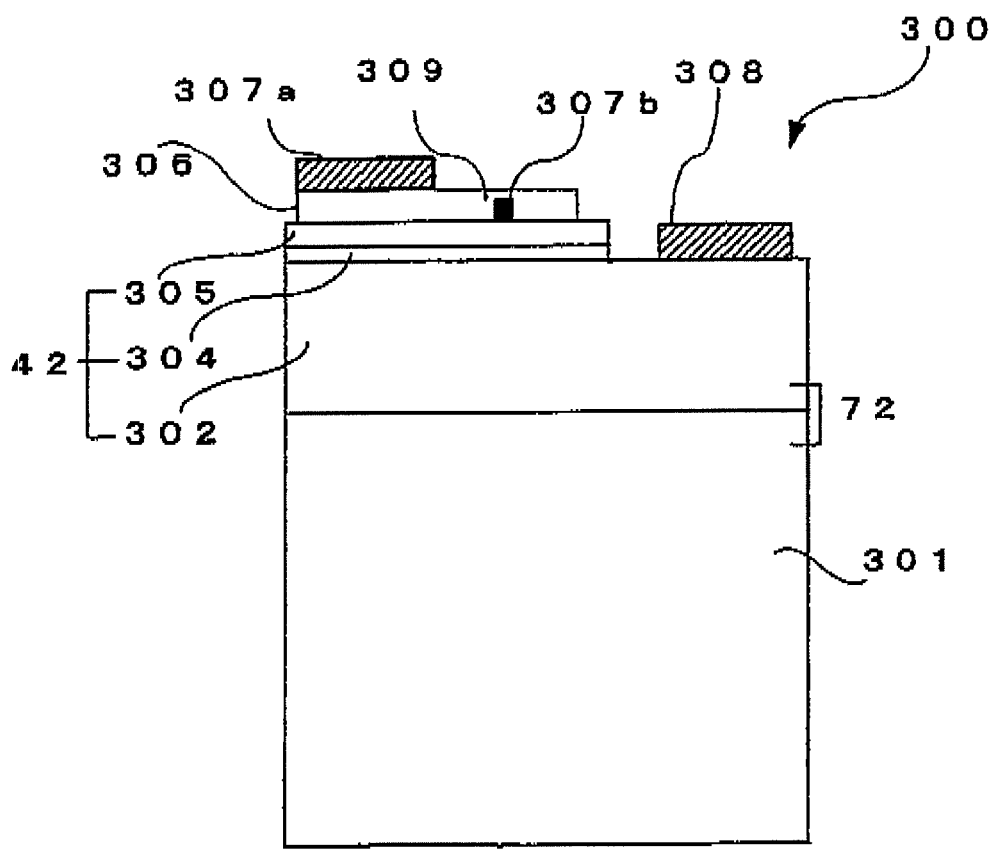
FIG. 7 is a schematic cross-sectional view along a dotted line VI-VI described in FIG. 6.

FIG. 6 is a schematic plan view of an LED 30 including, in addition to a pn junction provided for a light-emitting section, a pn junction structure (second pn junction structure) for improving a break-down voltage property manufactured in this Embodiment 4 outside the light-emitting section. Furthermore, FIG. 7 is a schematic cross-sectional view along a dotted line VI-VI of the high break-down voltage type LED shown in FIG. 6. In FIG. 6 and FIG. 7, the same components as those shown in FIG. 1 or FIG. 2 are described assigned the same reference numerals.

A stacked structure 300 for manufacturing the LED 30 was formed using an n-type silicon single crystal doped with phosphorus (element symbol: P) and having a (111) crystal as a substrate 301. Therefore, in this Embodiment 4, the first conductive type is an n-type.

On the surface made up of the (111) crystal surface of the n-type silicon single crystal substrate 301, a p-type monomeric boron phosphide (BP) layer (layer thickness of approximately 0.7 µm) 302 was provided directly joined thereto, and a second pn junction structure 72 was composed of the n-type silicon single crystal substrate 301 and the BP layer 302. The BP layer 302 of the conductive type opposite to the first conductive type (p-type in this Embodiment 4) was formed at 1050° C. using an MOCVD method using triethyl boron (molecular formula: $(C_2H_5)_3B$)) as a boron (B) source and phosphine (molecular formula: $PH_3$) as a phosphorus (P) source. This n-type BP layer 302 corresponds to the semiconductor layer of the second conductive type (p-type in this Embodiment 4) referred to in the present invention.

Separately, on the phosphorus-doped (111) silicon single crystal substrate having the same resistivity, carrier concentration and thickness as those used to form the above described second pn junction structure 72, a p-type BP layer of a second conductive type having the same specification as that described above was vapor-phase grown at 105° C. using an MOCVD method and a pn junction structure was formed. A gold (Au) film was coated on the back side of the n-type silicon single crystal substrate of the first conductive type using general vacuum deposition means, then sintered and an ohmic electrode was formed. An ohmic electrode made of an Au-zinc (element symbol: Zn) alloy film was formed on the surface of the p-type BP layer and the reverse break-down voltage of this pn junction ($V_B$ referred to in the present invention) was measured. The break-down voltage was approximately 6.5 V when the reverse current was set to 10 µA.

On the p-type BP layer 302 which is the second conductive type (p-type in this Embodiment 4), an n-type light-emitting layer 304 described above in Embodiment 1 was stacked, and then an upper clad layer 305 made of an n-type BP layer (layer thickness of approximately 0.4 µm, carrier concentration of approximately $1\times10^{19}$ cm$^{-3}$) was stacked using the MOCVD method and the stacked structure 300 was thereby formed.

After this, on the surface of the upper clad layer 305 of the first conductive type, a first polarity ohmic electrode (cathode in this Embodiment 4) 307b, and a pad electrode 307a therefor and a second polarity ohmic electrode (anode in Embodiment 4) 308 were formed using the procedure according to Embodiment 1. The second polarity ohmic electrode 308 of the other polarity was formed on the surface of the p-type BP layer 302 exposed in the removed region using dry etching means and the LED 30 was thereby formed. According to this Embodiment 4, the first polarity ohmic electrode 307b was composed of a plurality of gold (Au).Germanium (element symbol: Ge) alloy electrodes disposed independently of each other on the surface of the upper clad layer 305. The alloy electrodes arranged by being distributed on the surface of the upper clad layer 305 of the first conductive type (n-type in Embodiment 4) were shaped like a circle having a diameter of approximately 30 µm in a plan view.

These distributed ohmic electrodes 307b and the pad electrode 307a for supplying an LED drive current were configured in such a way that a conductive indium tin composite oxide film (English abbreviation: ITO) 309 was interposed between the ohmic electrodes 307b and the pad electrode 307a (see FIG. 7) and made electrically connected with each other. The ITO film 309 was formed to a film thickness of approximately 1 µm using a general high frequency sputtering method in order to be able to fully contact the side and top surface of the distributed respective ohmic electrodes 307b and absorb mechanical shock to the pad electrode 307a during bonding.

The LED 30, each side having a length of approximately 350 µm, was fixed to the supporter according to Embodiment 2 above and bonding was applied to the n-type silicon single crystal substrate 301 of the first conductive type (n-type in this Embodiment 4), first polarity ohmic electrodes (cathode in this Embodiment 4) 307b and pad electrode 307a such that these were equipotential to each other as in the case of Embodiment 2 above. The second polarity ohmic electrode (anode in this Embodiment 4) was bonded to the other electrode terminal electrically insulated from the electrode terminal to which the first polarity ohmic electrodes 307b were bonded. The LED 30 was then molded with epoxy resin for semiconductor device sealing to form an LED lamp.

When a forward current of 20 mA was passed in the forward direction between the electrode terminal continuous with the first polarity ohmic electrodes 307b and the electrode terminal continuous with the second polarity ohmic electrode 308, the forward voltage ($V_F$) was approximately 3.2 V. Furthermore, the reverse voltage ($V_R$) was approximately 13.0 V when the reverse current was set to 10 µA.

30 lamps were extracted from the manufactured LED lamps and subjected to a break-down voltage test using the technique described in Embodiment 2. As a result, when an overvoltage of 1000 V was intentionally applied in the reverse direction, the normal rectification characteristic of the pn junction provided for the light-emitting section was not reproduced and there was no LED lamp whose light-emitting section was judged to be destroyed.

That is, it was proven that no matter whether the first conductive type is a p-type as described in Embodiments 1 to 3 above or n-type as described in this Embodiment 4, or the first polarity ohmic electrode is an anode as described in Embodiments 1 to 3 above or a cathode as described in this Embodiment 4, or even when an overvoltage is applied in the reverse direction accidentally or intentionally, it is possible to stably provide an LED lamp having a high break-down voltage property using an LED including a pn junction structure (second pn junction structure) having a break-down voltage ($V_B$) related to $V_F$ and $V_R$ as described in the present invention.

INDUSTRIAL APPLICABILITY

The light-emitting diode according to the present invention is a light-emitting diode including a substrate made of a first conductive type silicon single crystal, a pn junction structured light-emitting section composed of a III-group nitride semiconductor on the substrate, a first polarity ohmic electrode for the first conductive type semiconductor provided on the light-emitting section and a second polarity ohmic electrode for a second conductive type semiconductor on the same side as the light-emitting section with respect to the substrate, wherein a second pn junction structure is provided which is made up of a pn junction between the first conductive type semiconductor layer and the second conductive type semiconductor layer.

As a result, the light-emitting diode of the present invention allows the size and cost to be reduced even when the break-down voltage is improved and further eliminates the necessity for any protective diode.

The invention claimed is:

1. A light-emitting diode comprising:
a first conductive type silicon single crystal substrate;
a light-emitting section including a first pn junction structure composed of a III-group nitride semiconductor on the silicon single crystal substrate;
a first polarity ohmic electrode for a first conductive type semiconductor provided on the light-emitting section; and
a second polarity ohmic electrode for a second conductive type semiconductor on the same side as the light-emitting section with respect to the silicon single crystal substrate,
wherein the second conductive type semiconductor layer comprises a boron phosphide (BP) base semiconductor and is directly joined to the silicon single crystal substrate, and the first conductive type silicon single crystal substrate and the second conductive type semiconductor layer form a second pn junction structure in a region which extends from the silicon single crystal substrate to the light-emitting section.

2. The light-emitting diode according to claim 1, wherein the reverse break-down voltage of the pn junction structure in the second pn junction structure is higher than the forward voltage of the light-emitting diode comprising the light-emitting section including the first pn junction structure and lower than the reverse voltage of the light-emitting diode.

3. A light-emitting diode lamp configured by fixing the light-emitting diode according to claim 2 to a supporter, wherein the first conductive type silicon single crystal substrate and the first polarity ohmic electrode are electrically connected to substantially the same potential.

4. The light-emitting diode lamp according to claim 3, wherein the region of the supporter electrically contacting the first conductive type silicon single crystal substrate is set to substantially the same potential as that of the first polarity ohmic electrode.

5. A light-emitting diode comprising:
a first conductive type silicon single crystal substrate;
a light-emitting section including a first pn junction structure composed of a III-group nitride semiconductor on the silicon single crystal substrate;
a first polarity ohmic electrode for a first conductive type semiconductor provided on the light-emitting section; and
a second polarity ohmic electrode for a second conductive type semiconductor on the same side as the light-emitting section with respect to the silicon single crystal substrate,
wherein a second conductive type intermediate layer is joined to the first conductive type silicon single crystal substrate, the second conductive type semiconductor layer is joined to the intermediate layer, and the first conductive type silicon single crystal substrate and the second conductive type intermediate layer form a second pn junction structure in a region which extends from the silicon single crystal substrate to the light-emitting section.

6. The light-emitting diode according to claim 5, wherein the intermediate layer comprises silicon carbide (SiC) having a silicon-rich nonstoichiometric composition.

7. The light-emitting diode according to claim 5, wherein the intermediate layer comprises a III-group nitride semiconductor.

8. The light-emitting diode according to claim 5, wherein the second conductive type semiconductor layer comprises a second conductive type III-group nitride semiconductor material.

9. A light-emitting diode comprising:
a first conductive type silicon single crystal substrate;
a light-emitting section including a first pn junction structure composed of a III-group nitride semiconductor on the silicon single crystal substrate;
a first polarity ohmic electrode for a first conductive type semiconductor provided on the light-emitting section; and
a second polarity ohmic electrode for a second conductive type semiconductor on the same side as the light-emitting section with respect to the silicon single crystal substrate,
wherein a first conductive type intermediate layer is joined to the first conductive type silicon single crystal substrate, the second conductive type semiconductor layer is joined to the intermediate layer, and the first conductive type intermediate layer and the second conductive type semiconductor form a second pn junction structure in a region which extends from the silicon single crystal substrate to the light-emitting section.

10. The light-emitting diode according to claim 9, wherein the intermediate layer comprises silicon carbide (SiC) having a silicon-rich nonstoichiometric composition.

* * * * *